United States Patent [19]

Moon

[11] Patent Number: 5,566,192
[45] Date of Patent: Oct. 15, 1996

[54] VARIABLE-LENGTH DECODER FOR BIT-STUFFED DATA

[75] Inventor: Heon-hee Moon, Suwon, Rep. of Korea

[73] Assignee: Samsung Electronics Co., Ltd., Kyungki-do, Rep. of Korea

[21] Appl. No.: 454,738

[22] Filed: May 31, 1995

[30] Foreign Application Priority Data

May 31, 1994 [KR] Rep. of Korea .................. 94-12227

[51] Int. Cl.[6] ............................................. G06F 11/00
[52] U.S. Cl. .................... 371/47.1; 375/253; 375/369; 341/67
[58] Field of Search ................... 371/47.1, 42, 46, 371/61, 62; 395/550, 185.08, 185.09; 370/100.1, 102; 375/253, 372, 369, 341, 368; 341/67

[56] References Cited

U.S. PATENT DOCUMENTS

| | | | |
|---|---|---|---|
| 3,804,982 | 4/1974 | Brown | 375/362 |
| 4,694,456 | 9/1987 | Morita et al. | 371/38 |
| 5,117,288 | 5/1992 | Eisenhardt et al. | 358/136 |
| 5,440,345 | 8/1995 | Shimoda | 348/411 |

*Primary Examiner*—Robert W. Beausoliel, Jr.
*Assistant Examiner*—Phung My Chung
*Attorney, Agent, or Firm*—Sughrue, Mion, Zinn, Macpeak & Seas

[57] ABSTRACT

A variable-length decoder variable-length-decodes a received variable-length-encoded data. The variable-length-encoded data is bit-stuffed in each data block to create data portions with a predetermined number of bits. Frame start codes representing a start of each frame and mass of macroblock start codes distinguishing between a plurality of masses of macroblocks are inserted into the data. Synchronization of data between frames and masses of macroblocks are accomplished via: a first-in-first-out (FIFO) memory which stores encoded data; a decoder which variable-length-decodes the input data in response to a control signal and generates an end-of-block (EOB) error signal when an EOB is not found; a decoding interface which interfaces between the decoder and a timing controller; and a timing controller which synchronizes decoding by use of start and initialization signals.

6 Claims, 4 Drawing Sheets

| 1ST WINDOW | 2ND WINDOW | 3RD WINDOW | 4TH WINDOW |
|---|---|---|---|
| MMB1 | MMB2 | MMB3 | MMB4 |
| MMB5 | MMB6 | MMB7 | MMB8 |
| . | . | . | . |
| . | . | . | . |
| . | . | . | . |
| . | . | . | . |
| MMB57 | MMB58 | MMB59 | MMB60 |

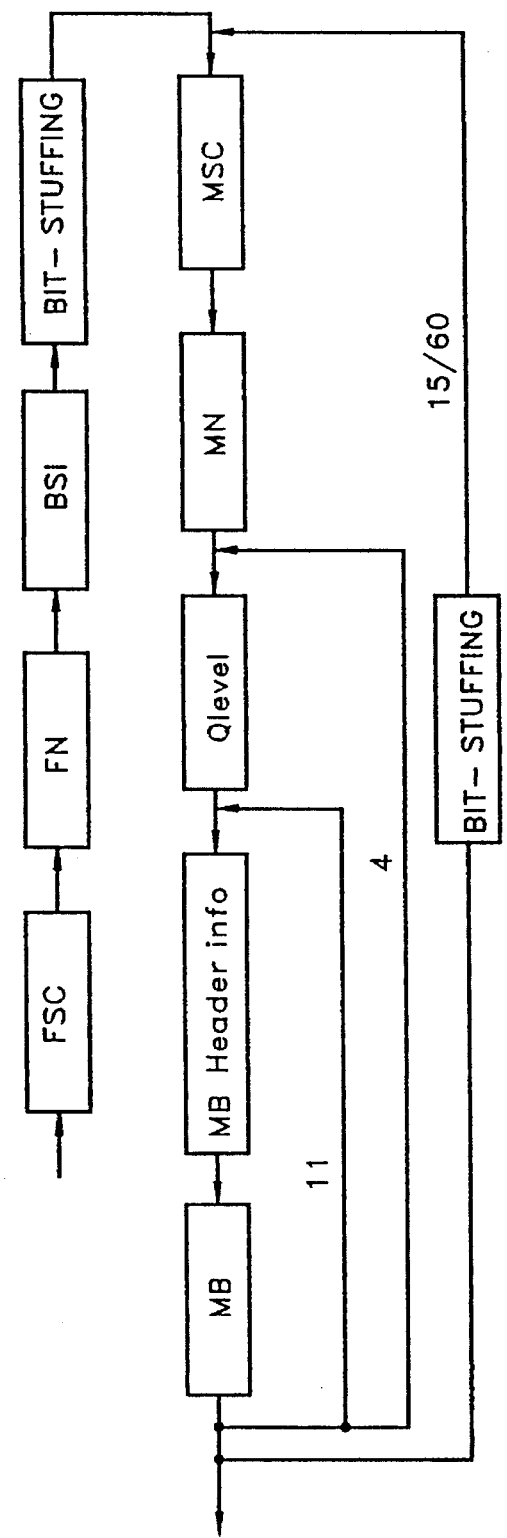
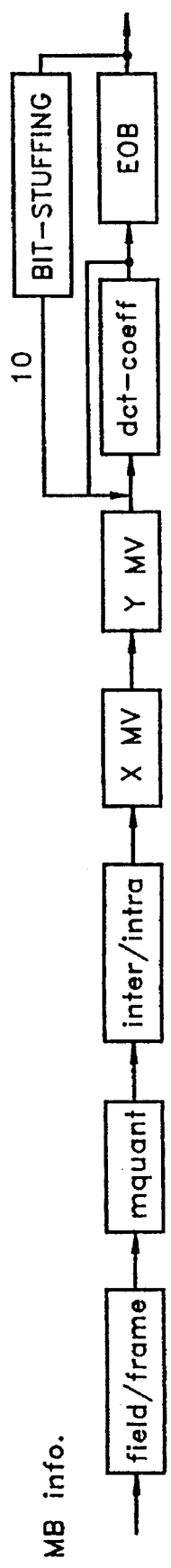
FIG. 4A
FIG. 4B

VARIABLE-LENGTH DECODER FOR BIT-STUFFED DATA

BACKGROUND OF THE INVENTION

1. Field of the Invention

The present invention relates to a variable-length decoder, and more particularly to a decoder for variable-length-decoding variable-length-encoded and bit-stuffed data.

Background

Generally, digital video signal encoding methods are divided into signal source encoding methods and entropy encoding methods. The signal source encoding method uses the redundancy contained in a video signal to compress video data. Here, discrete cosine transform (DCT), band-division encoding, and differential pulse code modulation (DPCM) methods are used.

The entropy encoding method uses statistical occurrence frequency, for which a variable-length coding (VLC) is representatively used, to further compress the data compressed by the signal source encoding method.

The VLC method is usually composed of a run-length coding method and a (modified) Huffman coding method. Here, a pair of "run" and "level" signals obtained by the run-length coding method is considered as a single symbol. Accordingly, shorter codewords are assigned symbols having higher occurrence frequencies in the Huffman code table. On the other hand, relatively longer codewords are assigned symbols having lower occurrence frequencies in the Huffman code table. Here, total data transmission rate is reduced.

Such encoding methods are currently being used in digital high-definition televisions (HDTV) and supported by the Moving Picture Expert Group (MPEG), whose standardization is pursued in the ISO/CCITT.

The digital HDTV system uses a combination of the signal source encoding method and the VLC method, which adopts the DCT or DPCM. Also, since the amount of the data to be processed is extremely large, a picture is divided into several windows before being processed, of which one example will be described below with reference to FIGS. 1 and 2.

FIG. 1 shows an encoding system for video data, while FIG. 2 shows a decoding system for video data. When the systems of FIGS. 1 and 2 are used, a picture is divided into four windows, whose processing lowers the video data speed.

In the encoding system of FIG. 1, input video data is initially divided into four channels by the channel divider 1. The divided channel data is compressed by signal source encoders 2A, 2B, 2C and 2D. The video data compressed by signal source encoders 2A through 2D is further compressed by variable-length encoders 3A through 3D. The data output from variable-length encoders 3A through 3D is then applied to multiplexer 4, which multiplexes the input data to produce an encoded bitstream.

The decoding system of FIG. 2 receives the encoded bitstream as input, in order to restore the video data to its prior-to-encoding form. An inverse multiplexer 5 separates the input bitstream into the data of the four channels.

Each of the variable-length decoders 6A through 6D variable-length-decodes the channel separated data and feeds it into the signal source decoders 7A through 7D. These decoders then decode the variable-length-decoded data to generate window data substantially the same as prior to its being encoded in the corresponding channel divider 1.

Multiplexer 8 multiplexes the respective window data output from signal source decoders 7A through 7D to generate decoded video data. The resulting data output from multiplexer 8 becomes substantially the same as the video data initially applied to the channel divider 1 of FIG. 1.

FIG. 3 shows that each frame picture is divided into four windows. Each window is composed of fifteen sets, with each set composed of four masses of macroblocks (MMBs).

When the system of FIG. 1 uses the data structure shown in FIG. 3, the system multiplexes the video data into MMB units. Each respective signal source encoder and variable-length encoder pair processes the MMBs belonging to a single window. For example, signal source encoder 2A and variable-length encoder 3A process the MMBs in the first window (MMB1, MMB5, . . . , MMB57).

As this data is fed into Multiplexer 4, the MMBs are multiplexed in the standard order from MMB1, MMB2, . . . , MMB60.

The system of FIG. 2 separates the encoded bitstream into the video data of each window via a procedure inverse to the multiplexing process of the FIG. 1 system. The separated video data in each window is variable-length decoded and signal-source decoded.

When the video data is transmitted from the FIG. 1 system at a constant transmission rate via a buffer (not shown), the amount of data generated by the signal source encoders and the variable-length encoders is not constant. Bit-stuffing and variable-length-encoding are performed to solve this problem. The bit-stuffing operation stuffs bits which are not filled with video information with meaningless information, like, for example, consecutive zeros.

Thus, an actual variable-length decoder receives data which has been variable-length-encoded and bit-stuffed. The variable-length-decoders 6A through 6D include a first-in-first-out (FIFO) memory and a variable-length decoder unit. The variable-length decoder unit reads out a predetermined number of bits of data from the FIFO memory to perform a variable-length decoding operation.

Therefore, when the bit-stuffed data bits are read out from the FIFO memory, the variable-length decoder cannot perform true variable-length decoding with respect to such bits. Reading the predetermined number of bits is difficult, as well as variable-length-decoding the bits following the bit-stuffed data.

Moreover, when an error is generated in the bitstream during transmission, the variable-length decoder performs incorrect variable-length decoding with respect to the error-generated bits. When the degree of the error is severe, data is wrongly read from the FIFO memory, thereby wrongly decoding the bits following the error-generated bit.

The above-described problems cause synchronization collapse between the decoded data corresponding to the respective windows, when one picture has been divided into four windows.

SUMMARY OF THE INVENTION

Therefore, to solve the above problems, it is an object of the present invention to provide a variable-length decoding apparatus in which frame start codes and mass of macroblock (MMB) start codes are used to control a reading operation of variable-length-encoded data from a FIFO memory, and the data read from the FIFO memory by such a control is variable-length-decoded.

To accomplish the above object of the present invention, there is provided a variable-length decoding apparatus for variable-length-decoding data transmitted in the form of a bitstream after the data has been bit-stuffed and variable-length-encoded. The data in each data block has been made to form a predetermined number of bits, with inserted frame start codes, each representing a start of a frame, and mass of macroblock (MMB) start codes, for discriminating between a plurality of the MMBs contained in each frame.

The invention uses the following devices, working in synchrony.

A first-in-first-out (FIFO) memory stores transmitted data and sequentially outputs the data to a decoding interface device, based on detection of a read signal.

A decoder variable-length-decodes input data in response to a control signal received from a timing controller. The decoder generates data request signals and sends them to the decoding interface device in order to receive encoded data. The decoder also generates an end-of-block (EOB) error signal when an EOB data is not detected in a block data interval.

A decoding interface device generates a read signal in response to start and initialization signals input from a timing controller, and data request signals input from a decoder. This device stores data input from the FIFO memory, and based upon request signals received from the decoder, inputs data to the decoder. The decoding interface device normally provides a read signal to the FIFO memory in order to receive data. But when a frame start code or an MMB start code are detected from the input data, the decoding interface device interrupts generating a read signal.

A timing controller generates the start signal in every frame interval and the initialization signal in every MMB interval. These signals are supplied to the decoding interface device. The timing controller also generates a new start signal to be supplied to the decoder if the EOB error signal has been input from it. The timing controller generates a signal for controlling the variable-length-decoding operation, which is supplied to the decoder.

BRIEF DESCRIPTION OF THE DRAWINGS

The preferred embodiments are described with reference to the drawings wherein:

FIGS. 4A and 4B are views showing an example of a bitstream to be decoded, proposed in the present invention;

DETAILED DESCRIPTION OF THE PREFERRED EMBODIMENT

A preferred embodiment of the present invention will be described below in more detail with reference to the accompanying FIGS. 4A-6.

FIGS. 4A and 4B show the structure of a bitstream used in a preferred embodiment of the present invention.

Figure 1:
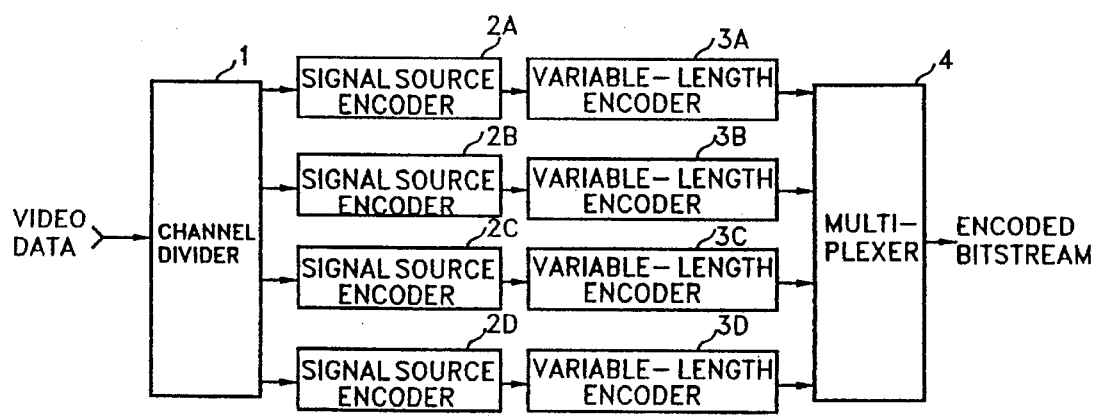
FIG. 1 is a block diagram of a general video signal encoding system.
Figure 2:
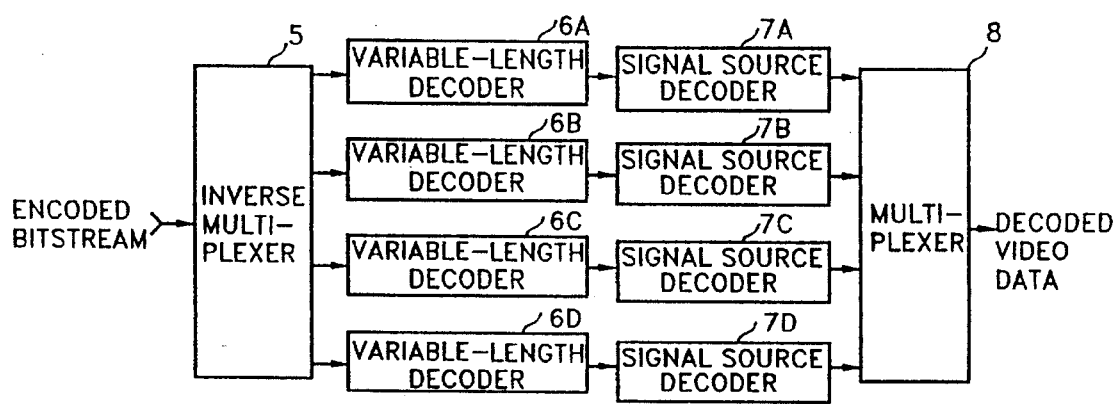
FIG. 2 is a block diagram of a general video signal decoding system.

FIG. 4A shows the structure of a bitstream belonging to one frame. The bitstream of FIG. 4A is constructed to beadapted in a case where a FIFO memory for a variable-length decoding operation outputs 24-bit data. A number of modifications are possible within the scope of the present invention for performing a variable-length decoding operation when the number of bits is different from 24. The structure of FIG. 4A depicts either the structure of a window data, separated by inverse multiplexer 5 in FIG. 2, or a one-frame bitstream data, prior to its being separated.

For a one-frame bitstream, the structure incudes frame head data comprising a frame start code (FSC), a frame number (FN), buffer status information (BSI) and stuffed bits. In a preferred embodiment of the present invention, the FSC has 32 bits, the FN has 4 bits, the BSI has 20 bits, and there are 16 stuffed bits.

Each frame is composed of sixty MMBs. If one frame is divided into four windows, then fifteen MMBs are contained in each window.

Each MMB has an MMB head data portion having a 24-bit MMB start code (MSC), an 8-bit MMB number (MN), and a number of stuffed bits.

The MMB also contains four q-levels, eleven macroblock header information portions, and a macroblock data portion.

The macroblock header information portion includes field/frame information, a macroblock q-level (mquant), inter/intra information, a horizontal motion vector (X—MV) and a vertical motion vector (Y—MB).

Each MMB also includes a DCT coefficient (dct-coeff) and an end-of-block (EOB) representing the end of that particular block.

In this example, the FSC, the frame number, the MSC, and the MN (or the MMB address), respectively, use a fixed-length code. Since the number of bits of the other codes vary, when the MMB data is not a multiple of 24 bits, the number of insufficient bits is added for bit stuffing.

Figures 3, 5:
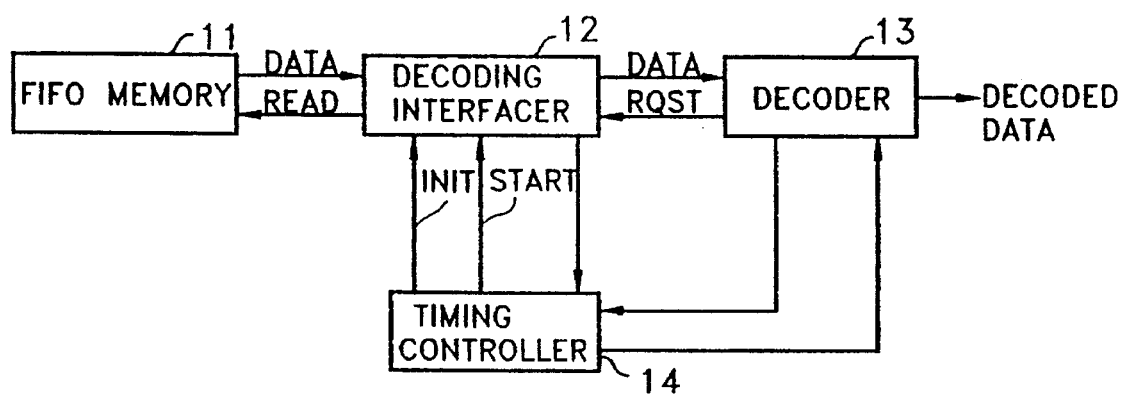
FIG. 3 is an example of a processing unit of video data according to the present invention.
FIG. 5 is a block diagram of a variable-length decoding apparatus according to a preferred embodiment of the present invention.

FIG. 5 is a block diagram of a variable-length decoding apparatus according to a preferred embodiment of the present invention. The FIG. 5 apparatus variable-length-decodes input data based on a basic data format with respect to bit-stuffed data, after it has been variable-length encoded.

In FIG. 5, a FIFO memory 11 stores a bitstream corresponding to one window described in relation to FIGS. 4A and 4B. Whenever a read signal is input from a decoding interface 12, a 24-bit data starting from firstly stored bits is output to the decoding interface 12.

When the decoding interface 12 detects an FSC or an MSC from the data read from FIFO memory 11, it outputs the detection resultant signal to timing controller 14. The decoding interface 12 also transmits the data read out from FIFO memory 11 to decoding unit 13.

Decoding unit 13 variable-length-decodes the data supplied from decoding interface 12 and generates a data request signal RQST, which is sent back to the decoding interface 12. In addition, when decoding unit 13 detects an end-of-block signal EOB, representing the end of a particular block, it generates and submits an end-of-block error signal and supplies it to timing controller 14.

Timing controller 14 can generate an initialization signal INIT and a start signal START, which are sent to decoding interface 12. It can also generate a control signal necessary for a variable-length-decoding operation, which is sent to decoding unit 13.

The detailed operation of the apparatus in FIG. 5, having the above-described construction, is described below.

When the FIG. 5 apparatus operates for the first time, timing controller 14 generates a start signal START to cause start of processing of a one-frame data, supplying the signal to decoding interface 12.

Decoding interface 12 generates a read signal READ in response to the start signal START, and outputs it to FIFO memory 11.

FIFO memory 11 receives the data corresponding to a single window and stores the received data. When a read signal READ is received (from the decoder interface 12), the 24-bit data is output, beginning with the first stored data, to the decoding interface 12.

Decoding interface 12 latches the data read from FIFO memory 11 in 72-bit intervals of data, using the latched data to detect the FSC. When the FSC is detected, decoding interface 12 outputs a detection resultant signal to timing controller 14.

When the detection resultant signal is applied to timing controller 14, it generates a new start signal START. The new start signal START is used for reading the data following the 72-bit data latched by decoding interface 12.

Timing controller 14 also generates a signal for controlling the data decoding operation for data supplied from FIFO memory 11 to decoding unit 13. This is accomplished by sending a data decoding signal to decoding unit 13.

Decoding interface 12 reads data from FIFO memory 11 in response to a new start signal START from timing controller 14. Upon receipt of this signal, the decoding interface 12 searches for an MSC. When an MSC is detected, a detection resultant signal is supplied to timing controller 14.

Timing controller 14 generates an initialization signal INIT in response to the detection resultant signal following MSC detection. The initialization signal INIT is generated before receipt of variable-length encoded MMB data by the FIFO memory 11.

After receiving a request signal RQST from decoding unit 13, and an initialization INIT signal from timing controller 14, decoding interface 12 commences reading data from FIFO memory 11.

Decoding unit 13 variable-length decodes the data supplied from decoding interface 12 using an internal decoding table, and generates and sends data request signals RQST to the decoding interface 12. As new data from FIFO memory 11 is input through decoding interface 12 upon receipt of the data request signal RQST, decoding unit 13 variable-length-decodes the input data.

When the input data cannot be decoded using the internal decoding table during the decoding operation, decoding unit 13 determines that the input data is bit-stuffed data, and then continuously generates and sends data request signals RQST to the decoding interface 12.

In a preferred embodiment of the present invention, the number of the bits for generating data request signal RQST is twenty four, which is the number of bits which are read from FIFO memory 11 at one time. Through the above procedure, the bit-stuffed bits, which are inserted into the rear end of the variable-length-encoded data, are removed.

When the data request signal RQST is generated in decoding unit 13 for removing the bit-stuffed bits, decoding interface 12 generates a read signal READ in response to the data request signal RQST, and further detects the MSC using the data supplied from FIFO memory 11. If the MSC is detected, decoding interface 12 stops generating the read signal READ and instead generates a detection resultant signal, which is sent to timing controller 14. When an MSC is detected, decoding interface 12 outputs the detection resultant signal to timing controller 14 and simultaneously holds the stored data. Decoding interface 12 then discontinues generating the read signal READ. Thus, the variable-length-encoded data in the MMB containing the detected MSC is not sent to decoding unit 13.

Timing controller 14 then generates the initialization signal INIT for the following MMB. After the initialization signal INIT is applied from timing controller 14, decoding interface 12 generates the read signal READ in response to the data request signal RQST from decoding unit 13. FIFO memory 11 outputs the stored data in response to the read signal READ input from decoding interface 12. When timing controller 14 generates a new initialization signal INIT, decoding interface 12 reads data from FIFO memory 11 in response to the data request signal RQST from decoding unit 13 and supplies the read data to decoding unit 13.

The following describes the operation of a variable-length-decoding performed with respect to fifteen MMB's per frame, through the above-described procedure.

Data is continuously received from FIFO memory 11 upon the receipt of a data request signal RQST, due to bit-stuffed bits filled in the fifteenth MMB. Subsequently, decoding interface 12 will detect the FSC. Timing controller 14 will generate a new start signal START of a frame interval when the FSC is detected.

The start signal is generated at the time frame immediately preceding when frame head data of a new frame is applied to decoding interface 12.

Decoding interface 12 generates a read signal READ in response to the start signal START, and sends the read signal to the FIFO memory 11. FIFO memory 11 outputs the stored data to decoding interface 12 in response to the read signal READ.

When an FSC is detected, decoding interface 12 does not generate the read signal READ any longer and holds the data supplied from the FIFO memory 11 in place. Then, the decoding interface 12 latches to the first MSC in the frame. Thus, decoding interface 12 detects the FSC and MSC with respect to the start signal generated in every frame except for the initial operation. If the initialization signal INIT is applied from timing controller 14, decoding interface 12 performs an operation in which the data from FIFO memory 11 is supplied to decoding unit 13 in response to the data request signal RQST.

During the time when a variable-length-decoding operation is proceeding, decoding unit 13 judges whether an end-of-block data EOB, representing the end of each block, exists. If the EOB data is not obtained by the decoding operation, decoding unit 13 generates an EOB error signal and sends it to the timing controller 14. Decoding unit 13 also generates the data request signal RQST, permitting the decoding interface 12 to read the data of the error-generated MMB.

When the EOB error signal is received, timing controller 14 generates a control signal for interrupting the operation of decoding unit 13 until the detection resultant signal is no longer applied from decoding interface 12. Timing controller 14 also generates a new start signal START and outputs it to the decoding interface 12. Decoding unit 13 does not decode the data input from decoding interface 12 based on the control of timing controller 14. Decoding interface 12 then continuously reads the stored data from FIFO memory 11 in response to the start signal and searches for the next FSC or MSC, attempting to resume synchronization.

Thus, when an error is generated in the bitstream, residue data is read until the following MMB data shows up, thereby reconstructing the lost synchronization. The operation that follows was already explained above.

Figure 6:
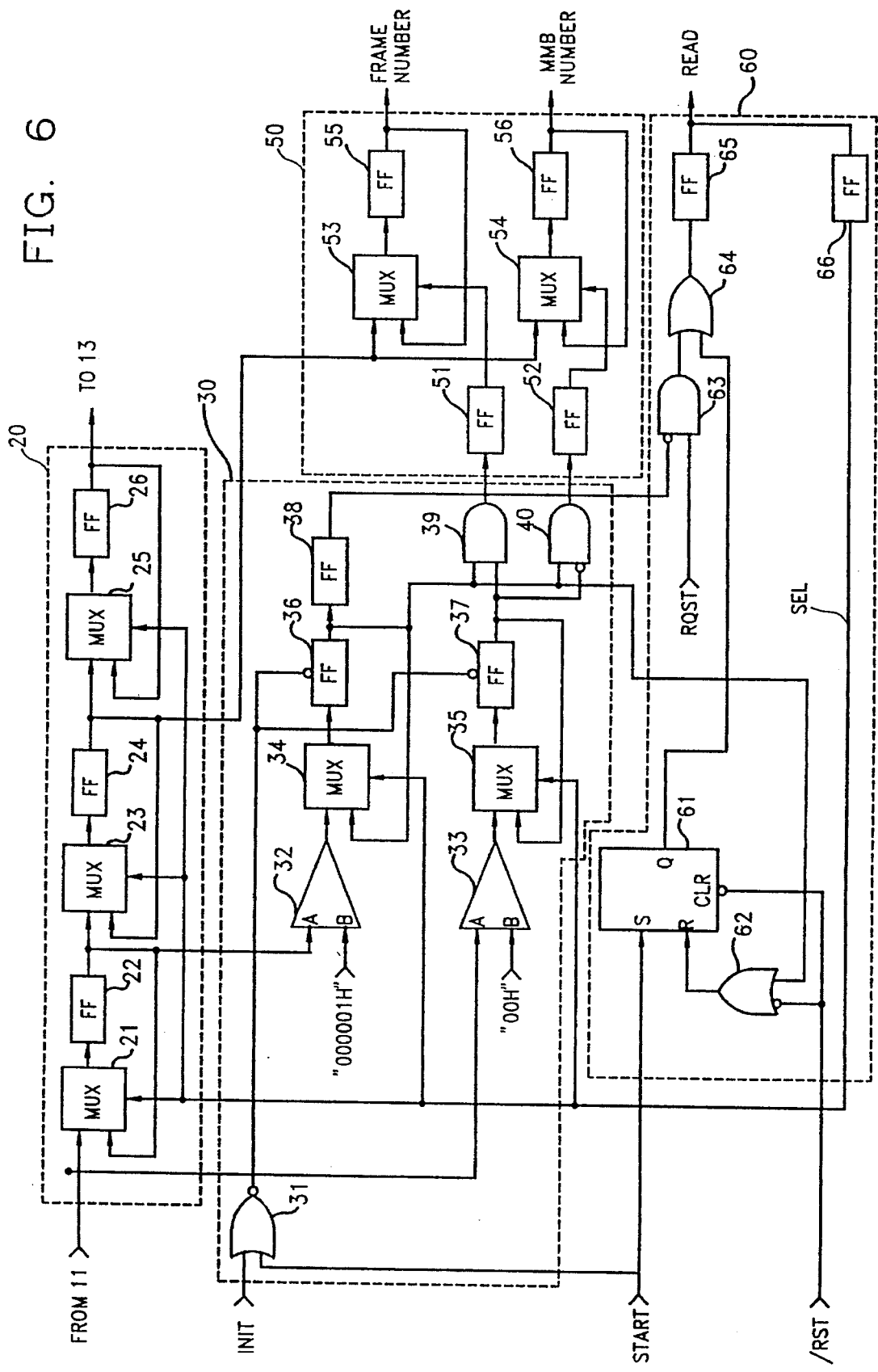
FIG. 6 is a circuit diagram showing an example of the detailed construction of the decoding interface of FIG. 5.

FIG. 6 is a circuit diagram showing an example of the detailed construction of the decoding interface 12 of FIG. 5. The FSC used in the FIG. 6 apparatus is a hexadecimal of value "00000100H" and the MSC used is a hexadecimal of value "000001H." The construction and operation of the FIG. 6 apparatus will be described below.

Decoding interface 12 comprises a data latch portion 20, an FSC/MSC detector 30, a number output portion 50 and a control signal generator 60. If a high-level pulse start signal or an initialization signal INIT from timing controller 14 is applied to FSC/MSC detector 30 and control signal generator 60, flip-flops 36 and 37 in FSC/MSC detector 30 are cleared by the low-level pulse applied to the reset end via NOR gate 31, so that the output values equal zero. RS flip-flop 61 in control signal generator 60 is cleared by a reset signal/RST and outputs a binary value of "1" via the output end Q in response to the start signal START applied to the end S. A flip-flop 65 latches a binary value of "1" applied from RS flip-flop 61 via an OR gate 64. The binary signal latched to flip-flop 65 is output to FIFO memory 11 and flip-flop 66. The binary value of "1" output from flip-flop 65 is used as a read signal READ by FIFO memory 11. The output of flip-flop 66 is used as a select signal SEL for controlling multiplexers 21, 23, 25, 34 and 35. In data latch portion 20, flip-flops 22, 24 and 26 sequentially latch the data output from FIFO memory 11 by predetermined bits in response to the read signal from control signal generator 60. The data latched in flip-flop 26 is supplied to decoding unit 13. Multiplexer 21 receives the output data from FIFO memory 11 and flip-flop 22, and selects one therebetween according to a binary value of the select signal output from control signal generator 60, supplying the selected signal to flip-flop 22. Multiplexer 23 receives the output data from flip-flop 22 and flip-flop 24, and selects one therebetween according to a binary value of the select signal, supplying the selected signal to flip-flop 24. Likewise, multiplexer 25 receives the output data from flip-flop 24 and flip-flop 26, and selects one therebetween according to a binary value of the select signal, supplying the selected signal to decoding unit 13. Comparator 32 in the FSC/MSC detector 30 compares the output data from flip-flop 22 with the MSC of value "000001H." Comparator 32 outputs a binary value of "1" if these data values are equal. Multiplexer 34 selects either the output data of comparator 32 or of flip-flop 36 according to the select signal from control signal generator 60. The output signal is input to flip-flop 36. The output data from flip-flop 36 is input to flip-flop 38 and control signal general 60. A comparator 33 compares the data applied to flip-flop 21 with a part of the FSC of "00H." Comparator 33 outputs a binary value of "1" if these data values are equal. Multiplexer 35 selects between the output data of comparator 33 and flip-flop 37 according to the select signal and outputs the selected one to flip-flop 37. The output data from flip-flop 37 is supplied to the inputs of AND gates 39 and 40. AND gate 39 logically multiplies the output data of flip-flops 36 and 37 and supplies the result to number output portion 50. AND gate 40 logically multiples the inverted output data of flip-flop 36 and the output data from flip-flop 37 and supplies the result to number output portion 50.

On the other hand, RS flip-flop 61 in control signal generator 60 outputs a binary signal of "0" via output end Q in response to a first binary signal, if flip-flop 36 outputs the first binary signal having the value of "1" according to the FSC or MSC detection. AND gate 63 logically multiples the data request signal RQST from decoding unit 13 by the inverted output data of flip-flop 38, and outputs the result. OR gate 64 logically sums the output data of RS flip-flop 61 and AND gate 63 and outputs the result. Flip-flop 65 latches the output from OR gate 64. The data output from flip-flop 65 is used as a read signal applied to FIFO memory 11. Flip-flop 66 latches the output data from flip-flop 65. The output data from flip-flop 66 is used as a select signal SEL for multiplexers 21, 23, 25, 34 and 35.

Number output portion 50 comprises flip-flops 55 and 56 for latching the data applied from flip-flop 24. Multiplexer 53 selects between the data from flip-flops 55 and 24 according to the output data from AND gate 39 latched in flip-flop 51 and outputs the result to flip-flop 55. Also, multiplexer 54 selects between the data from flip-flops 56 and 24 according to the output data from AND gate 40 latched to flip-flop 52, and outputs the result to flip-flop 56. Flip-flop 55 latches the frame number, and flip-flop 56 latches the MMB number, according to the data selection of multiplexers 53 and 54.

As described above, the variable-length-decoding apparatus for the bit-stuffed data according to the present invention synchronizes the data supplied to the decoding unit based on the detection of the FSC and the MSC. In the event errors may be generated, the MMB's following the error-generated MMB can be accurately decoded. In addition, when a video frame is processed by dividing the video frame into a plurality of windows, and the amounts of the bit-stuffed data portions differ from one another with respect to the data windows, the present invention allows for synchronization between the windows to allow for accurate matching.

While only certain embodiments of the invention have been specifically described herein, it will apparent that numerous modifications may be made thereto without departing from the spirit and scope of the invention.

What is claimed is:

1. A variable-length decoding apparatus for variable-length-decoding data transmitted in the form of a bitstream, said data having been bit-stuffed and variable-length-encoded into a predetermined number of bits, said data further having been separated into a plurality of masses of macroblocks which form a number of frames, the initial portion of each frame including a predeterminedly set frame start code, the initial portion of each mass of macroblock including a predeterminedly set mass of macroblock start code, said variable-length decoding apparatus comprising:

a first-in-first-out memory for storing transmitted data and sequentially outputting a predetermined number of bits of said data beginning with firstly stored bits, said storing and sequential outputting of said data occurring every time a read signal is input to said memory;

a decoder for variable-length-decoding data input thereto in response to a control signal received thereto, said decoder generating a data request signal every time the number of bits of said data input thereto equals a predetermined number, said decoder generating an end-of-block error signal when an end-of-block data signal is not received thereto in one of a plurality of block data intervals;

a decoding interface device for generating said read signal in response to a start signal and said data request signal received thereto, said data request signal being output from said decoder, said interface device receiving and subsequently storing said predetermined number of data bits from said first-in-first-out memory in response to said read signal, said interface device interrupting generation of said read signal if one of said frame start code and said mass of macroblock start code is detected from said input data bits, said interface device supplying said predetermined number of bits of said input data to said decoder when an initialization signal is received thereto; and a timing controller for generating said start signal in each of a plurality of frame intervals, said controller generating said initialization signal in each of a plurality of masses of macroblock intervals, said start and said initialization signals being supplied to said decoding interface device, said timing controller generating a new start signal to be supplied to said decoder if said end-of-block signal is input thereto, said timing controller generating a signal supplied to said decoder for controlling said variable-length-decoding operation.

2. A variable-length decoding apparatus according to claim 1, wherein said decoding interface device further comprises:

a data latch portion, a data input end therefrom being connected to a data output end of said first-in-first-out memory, a data output end of said latch portion being connected to said decoder, said data latch portion being used for latching said data output from said first-in-first-out memory by a predetermined number of bits every time said read signal is input to said memory;

a detector which receives both a latched data from said data latch portion and said output data from said first-in-first-out memory, said detector detecting said frame start signal and said mass of macroblock start signal, said detector outputting a first binary signal, the value of said binary signal indicating a result of said detection, said detector clearing said binary signal if either said start signal or said initialization signal is input to said decoding interface device from said timing controller;

a control signal generator for generating said read signal, a value of said read signal being either a first binary value for enabling reading of data from said first-in-first-out memory, or a second binary value for disabling reading of data from said first-in-first-out memory, said control signal generator further generating a select signal, a value of said select signal being either a first binary value for newly latching said data supplied from said first-in-first-out memory, and a second binary value for maintaining said already-latched data supplied from said first-in-first-out memory.

3. A variable-length decoding apparatus according to claim 2, wherein said data latch portion further comprises:

first and second latches for sequentially latching said data output from said first-in-first-out memory by bits that have been predetermined, and outputting said latched data to said decoder;

a first multiplexer for receiving said output data from said first-in-first-out memory and said output data from said first latch, said first multiplexer outputting said received data to said first latch according to a binary value of said select signal; and a second multiplexer for receiving said output data from said first and second latches and outputting the received data to said second latch according to said binary value of said select signal.

4. A variable-length decoding apparatus according to claim 3, wherein said detector further comprises:

third and fourth latches, the output values therefrom being cleared to a zero value upon receipt of either said start signal or said initialization signal from said timing controller;

a first comparator for comparing said output data from said first latch with said predeterminedly set mass of macroblock start code, said first comparator outputting a binary value of "1" if said output data from said first latch equals said predeterminedly set mass of macroblock start code, said first comparator outputting a binary value of "0" if said output data from said first latch does not equal said predeterminedly set mass of macroblock start code;

a second comparator for comparing said data input to said first multiplexer with a part of said predeterminedly set frame start code, said outputting comparator outputting a binary value of "1" if said data input to said first multiplexer is equal to said part of said predeterminedly set frame start code, said outputting comparator outputting a binary value of "0" if said data input to said first multiplexer is not equal to said part of said predeterminedly set frame start code;

a third multiplexer for selecting either the output data of said third latch or the data of said first comparator, said determination being based on said select signal, said third multiplexer outputting a selected result to said third latch;

a fourth multiplexer for selecting either the output data of said fourth latch or the data of said second comparator, said determination being based on said select signal, said fourth multiplexer outputting a selected result to said fourth latch;

a fifth latch for latching said data output from said third latch.

5. A variable-length decoding apparatus according to claim 4, wherein said control signal generator further comprises:

an RS flip-flop for receiving a start signal from said timing controller via one input end thereto and a first binary signal from said third latch via another input end thereto, said RS flip-flop outputting data therefrom via an output end therefrom;

an AND gate for logically multiplying said data request signal output from said decoding means by an inverted output data of said fifth latch;

an OR gate for logically summing the output data from said RS flip-flop and the output data from said AND gate, said OR gate outputting a logically summed result;

a sixth latch for latching the output from said OR gate, said sixth latch outputting a latched result therefrom as said read signal, said read signal being applied to said first-in-first-out memory; and a seventh latch for latching the output data from said sixth latch, said seventh latch outputting a latched result therefrom as said select signal.

6. A variable-length decoding apparatus according to claim 1:

wherein said decoding interface device generates a detection resultant signal if the frame start code is detected, and wherein said generated signal is outputted to said timing controller, and wherein said timing controller outputs the start signal for the first operation of said variable-length-decoding apparatus to said decoding interface means, said controller generates a new start signal to read the data containing the mass of macroblock start code from said first-in-first-out memory based on a detection resultant signal if the detection resultant signal is applied from said decoding interface means in response to the start signal for the first operation, and said controller outputs the generated new start signal to said decoding interface means.

* * * * *